(12) United States Patent
Miyashita et al.

(10) Patent No.: US 8,974,685 B2
(45) Date of Patent: Mar. 10, 2015

(54) FINE-PROCESSING AGENT AND FINE-PROCESSING METHOD

(75) Inventors: Masayuki Miyashita, Sakai (JP); Takanobu Kujime, Sakai (JP); Keiichi Nii, Sakai (JP)

(73) Assignee: Stella Chemifa Corporation, Osaka-Shi (JP)

( * ) Notice: Subject to any disclaimer, the term of this patent is extended or adjusted under 35 U.S.C. 154(b) by 24 days.

(21) Appl. No.: 13/320,171

(22) PCT Filed: May 21, 2009

(86) PCT No.: PCT/JP2009/059370
§ 371 (c)(1),
(2), (4) Date: Nov. 11, 2011

(87) PCT Pub. No.: WO2010/134184
PCT Pub. Date: Nov. 25, 2010

(65) Prior Publication Data
US 2012/0056126 A1 Mar. 8, 2012

(51) Int. Cl.
*C03C 15/00* (2006.01)
*H01L 21/311* (2006.01)
*C09K 13/08* (2006.01)

(52) U.S. Cl.
CPC .......... *H01L 21/31111* (2013.01); *C09K 13/08* (2013.01)
USPC .................. 216/83; 216/41; 216/97; 216/99; 252/79.1; 252/79.2; 252/79.3; 252/79.4

(58) Field of Classification Search
USPC .............. 252/79.1–79.4; 216/41, 97, 99, 108, 216/109
See application file for complete search history.

(56) References Cited

U.S. PATENT DOCUMENTS

| | | | |
|---|---|---|---|
| 5,854,107 A | 12/1998 | Park et al. | |
| 6,097,055 A | 8/2000 | Lee et al. | |
| 6,245,640 B1 * | 6/2001 | Claussen et al. | 438/424 |
| 6,821,452 B2 * | 11/2004 | Kikuyama et al. | 216/41 |
| 2002/0063106 A1 | 5/2002 | Luly et al. | |
| 2003/0004075 A1 * | 1/2003 | Suto et al. | 510/175 |
| 2003/0178728 A1 | 9/2003 | Park et al. | |
| 2004/0063286 A1 | 4/2004 | Kim et al. | |
| 2004/0194800 A1 * | 10/2004 | Chang et al. | 134/2 |
| 2004/0209463 A1 | 10/2004 | Kim et al. | |
| 2005/0081883 A1 | 4/2005 | Ko et al. | |
| 2005/0118813 A1 | 6/2005 | Korzenski et al. | |
| 2005/0118832 A1 | 6/2005 | Korzenski et al. | |
| 2005/0169096 A1 | 8/2005 | Lee et al. | |
| 2005/0189583 A1 | 9/2005 | Kim et al. | |
| 2006/0183297 A1 | 8/2006 | Mun et al. | |
| 2007/0111532 A1 * | 5/2007 | Lee et al. | 438/745 |
| 2007/0111533 A1 | 5/2007 | Korzenski et al. | |
| 2008/0090362 A1 | 4/2008 | Kim et al. | |
| 2008/0210900 A1 * | 9/2008 | Wojtczak et al. | 252/79.3 |

FOREIGN PATENT DOCUMENTS

| | | |
|---|---|---|
| DE | 19603572 C1 | 10/1997 |
| JP | 10-98155 A | 4/1998 |
| JP | 2000-22112 A | 1/2000 |
| JP | 2001-249465 A | 9/2001 |
| JP | 2002-134468 A | 5/2002 |
| JP | 2003-035963 A | 2/2003 |
| JP | 2003-297952 A | 10/2003 |
| JP | 2005-303305 A | 10/2005 |
| JP | 2005-328067 A | 11/2005 |
| JP | 2007-513522 A | 5/2007 |
| JP | 2008-541447 A | 11/2008 |
| RU | 2121563 C1 | 11/1998 |

OTHER PUBLICATIONS

Search Report for corresponding European Patent Application No. 09844917.6 dated Nov. 20, 2012.
Office Action issued Jul. 3, 2012 in corresponding Japanese Patent Application No. 2008-054736.
Office Action issued Aug. 21, 2013 in corresponding Chinese Patent Application No. 200980159339.3.
Office Action issued Mar. 27, 2014 in corresponding CN Application No. 200980159339.3.
Office Action issued Jun. 5, 2014 in corresponding TW Application No. 098117194.
Office Action issued Nov. 6, 2014 in corresponding TW application No. 098117194.

\* cited by examiner

*Primary Examiner* — Lan Vinh
*Assistant Examiner* — Maki Angadi
(74) *Attorney, Agent, or Firm* — Knobbe Martens Olson & Bear LLP

(57) ABSTRACT

Provided is a fine-processing agent which, when fine-processing a laminated film stacked at least with a silicon dioxide film and a silicon nitride film, can selectively fine-process the silicon dioxide film. Also provided is a fine-processing method utilizing the fine-processing agent. The fine-processing agent is characterized by including: (a) 0.01-15.0 weight % hydrogen fluoride and/or 0.1-40.0 weight % ammonium fluoride, (b) water, and (c) 0.001-10.00 weight % water-soluble polymer selected from among a group consisting of acrylic acid, ammonium acrylate, acrylic acid ester, acrylamide, styrenesulfonic acid, ammonium styrenesulfonate, and styrenesulfonic acid ester.

13 Claims, No Drawings

FINE-PROCESSING AGENT AND FINE-PROCESSING METHOD

CROSS-REFERENCE TO RELATED APPLICATIONS

This application is the U.S. National Phase under 35. U.S.C. §371 of International Application PCT/JP2009/059370, filed May 21, 2009. The International Application was published under PCT Article 21(2) in a language other than English.

TECHNICAL FIELD

The invention relates to a fine processing agent for use in fine processing, cleaning, or other processes in the manufacture of semiconductor devices, liquid crystal display devices, micromachines (micro electro mechanical systems (MEMS)) devices, etc., and to a fine processing method using such an agent. In particular, the invention relates to a fine processing agent for use in fine processing of a laminated film in which at least a silicon oxide film and a silicon nitride film are laminated, and to a fine processing method using such an agent.

BACKGROUND ART

Among semiconductor device manufacturing processes, one of the most important processes is patterning and etching of a silicon oxide film, a silicon nitride film, a polysilicon film, a metal film, or any other film formed on the surface of a wafer into the desired shape. Wet etching, one of such etching techniques, has required a fine processing agent capable of selectively etching only an etching target film.

When a silicon oxide film is the target of etching, examples of such a fine processing agent include buffered hydrofluoric acid and hydrofluoric acid. However, when such buffered hydrofluoric acid or hydrofluoric acid is used as a fine processing agent in the processing of a laminated film composed of a silicon oxide film and a silicon nitride film, the silicon nitride film is also etched at the same time. As a result, patterning into the desired shape becomes difficult.

For example, a fine processing agent containing hydrofluoric acid and an anionic surfactant such as ammonium lauryl sulfate can solve such a problem and selectively etch only a silicon oxide film (see Patent Document 1 listed below). Unfortunately, such a fine processing agent has very high foaming ability and therefore is not suitable for use in semiconductor device manufacturing processes.

On the other hand, for example, a DRAM (Dynamic Random Access Memory) is a semiconductor device that is produced through wet etching with a fine processing agent. A DRAM cell includes one transistor and one capacitor. DRAM integration has increased about four times in the last three years. DRAM integration is generally achieved by integration of capacitors. Therefore, while the area occupied by a capacitor is reduced, an increase in capacitor area, a reduction in capacitor insulating film thickness, and incorporation of a high dielectric constant film are made so that the capacitance required for stable storage operation can be ensured.

A silicon oxide film has been used as the capacitor insulating film, and a reduction in the film thickness has been made. However, the reduction in the thickness of a silicon oxide film as a capacitor insulating film has reached a limit for 1 Mbit DRAM. In a 4 Mbit DRAM, therefore, a silicon nitride film is used as an insulating film. As integration has proceeded, a tantalum oxide film has also begun to be used.

A 64 Mbit generation DRAM has a cylindrical capacitor structure. The problem described below occurs when a conventional etchant is used in a process that includes forming cylindrical capacitor lower electrodes and then removing the formed silicon oxide film by wet etching to form a capacitor.

Specifically, after the capacitor lower electrodes are formed, the formed silicon oxide film is removed by wet etching, and rinsing with ultrapure water and drying are further performed. The drying process has the problem that due to the surface tension of water present between the capacitor lower electrodes, a "leaning" phenomenon, in which the lower electrodes lean and come into contact with each other, frequently occurs to induce 2-bit failure. Thus, Patent Document 2 listed below discloses a technique for forming a silicon nitride support film between capacitor lower electrodes. Patent Document 3 listed below also discloses a technique for forming a silicon nitride film as an insulating film for improving insulating properties from bit lines, and Patent Document 4 listed below also discloses a technique for forming a silicon nitride film as an etching stopper film for the subsequent process of etching a silicon oxide film.

In these semiconductor device manufacturing processes, the use of a conventional etchant has the problem that the silicon oxide film disclosed as a support film in Patent Document 1, the silicon nitride film disclosed in Patent Document 2, or the silicon oxide film disclosed as an etching stopper film in Patent Document 3 is also etched together with the etching target.

PRIOR ART DOCUMENTS

Patent Documents

Patent Document 1: Japanese Patent Application Laid-Open (JP-A) No. 2005-328067
Patent Document 2: JP-A No. 2003-297952
Patent Document 3: JP-A No. 10-98155
Patent Document 4: JP-A No. 2000-22112

SUMMARY OF THE INVENTION

Problems to be Solved by the Invention

The invention has been made in view of the above problems, and an object of the invention is to provide a fine processing agent that allows selective fine processing of a silicon oxide film when a laminated film in which at least a silicon oxide film and a silicon nitride film are laminated is subjected to fine processing, and to provide a fine processing method using such an agent.

Means for Solving the Problems

To solve the conventional problems, the inventors have made earnest studies on fine processing agents and fine processing methods using them. As a result, the invention has been completed based on the finding that a fine processing agent containing a specific water-soluble polymer allows selective fine processing of only a silicon oxide film in the processing of a laminated film composed of the silicon oxide film and a silicon nitride film.

Thus, to solve the above problems, the invention provides a fine processing agent, including: (a) at least one of 0.01 to 15% by weight of hydrogen fluoride or 0.1 to 40% by weight of ammonium fluoride; (b) water; and (c) 0.001 to 10% by weight of a water-soluble polymer of at least one selected from the group consisting of acrylic acid, ammonium acrylate, an acrylic acid ester, acrylamide, styrenesulfonic acid, ammonium styrenesulfonate, and a styrenesulfonic acid ester.

According to the feature, the fine processing agent of the invention, which contains the water-soluble polymer, can reduce the effect of etching a silicon nitride film without reducing the effect of etching a silicon oxide film. As a result, for example, the use of the fine processing agent of the invention in fine processing of a laminated film composed of a silicon oxide film and a silicon nitride film allows selective fine processing of the silicon oxide film and suppression of the etching of the silicon nitride film. This can improve the yield ratio in a semiconductor device manufacturing process.

In the composition, the content of the water-soluble polymer is in the range of 0.001 to 10% by weight. When the lower limit is set at 0.001% by weight, the addition of the water-soluble polymer is effective so that etching of a silicon nitride film can be suppressed. Setting the upper limit at 10% by weight makes it possible to suppress an increase in metal impurities in the fine processing agent. It also suppresses an increase in viscosity, which can prevent a reduction in the ability to remove the fine processing agent by rinsing with a rinse agent such as ultrapure water. As used herein, the term "fine processing" is intended to include etching of a processing target film and cleaning of the surface of a processing target film. The term "water-soluble polymer" means a polymer that can be dissolved at a concentration of 1% by mass (10 g/L) or more at room temperature in a mixed solution containing the components (a) and (b).

In the composition, the water-soluble polymer is preferably a copolymer of ammonium acrylate and methyl acrylate.

In the composition, the water-soluble polymer is also preferably polyacrylamide.

In addition, in the composition, the water-soluble polymer preferably has a weight average molecular weight in the range of 1,000 to 1,000,000. The water-soluble polymer with a weight average molecular weight of 1,000 or more can be produced with a small amount of a stabilizer serving as a polymerization inhibitor. As a result, the water-soluble polymer can be prevented from being contaminated with metal. On the other hand, when the weight average molecular weight is set at 1,000,000 or less, an increase in the viscosity of the fine processing agent can be suppressed so that handleability can be improved. It can also prevent a reduction in the ability to remove the fine processing agent by rinsing with a rinse agent such as ultrapure water.

The composition also preferably has an etch rate in the range of 1 to 5,000 nm/minute for a silicon oxide film at 25° C. This can not only prevent an increase in the time period of fine processing of a silicon oxide film so that production efficiency can be improved, but also make it easy to control the thickness and surface roughness of the silicon oxide film after the fine processing.

To solve the above problems, the invention also provides a fine processing method that includes performing fine processing of a laminated film in which at least a silicon oxide film and a silicon nitride film are laminated, while using the above fine processing agent.

In the method, a laminated film composed of at least a silicon oxide film and a silicon nitride film is processed using the fine processing agent, which contains the water-soluble polymer and therefore can reduce the effect of etching a silicon nitride film without reducing the effect of etching a silicon oxide film, so that selective fine processing of the silicon oxide film can be achieved, while the etching of the silicon nitride film is suppressed. As a result, the yield ratio can also be improved in a semiconductor device manufacturing process.

The silicon oxide film is preferably any one of a natural oxide film, a thermal silicon oxide film, a non-doped silicate glass film, a phosphorus-doped silicate glass film, a boron-doped silicate glass film, a boron-and-phosphorus-doped silicate glass film, a TEOS film, or a fluorine-containing silicon oxide film.

The silicon nitride film is preferably a silicon nitride film or a silicon oxynitride film.

Effects of the Invention

The invention produces the advantageous effects as described below by the means described above.

Specifically, when a laminated film composed of at least a silicon oxide film and a silicon nitride film is subjected to fine processing, the invention makes possible selective fine processing of only the silicon oxide film, so that successful fine processing can be achieved, for example, in the manufacture of semiconductor devices, liquid crystal display devices, micromachine devices, etc.

EMBODIMENTS FOR CARRYING OUT THE INVENTION

An embodiment of the invention is described below.

A fine processing agent according to an embodiment of the invention contains (a) at least one of hydrogen fluoride or ammonium fluoride, (b) water, and (c) a water-soluble polymer.

The content of hydrogen fluoride as the component (a) is preferably in the range of 0.01 to 15% by weight, more preferably in the range of 0.05 to 10% by weight, based on the total weight of the fine processing agent. If the hydrogen fluoride content is less than 0.01% by weight, it will be difficult to control the hydrogen fluoride concentration so that there may be significant variations in the etch rate for a silicon oxide film. If the hydrogen fluoride content is more than 15% by weight, the etch rate for a silicon oxide film will be too high so that the etching controllability may be low.

The content of ammonium fluoride is preferably in the range of 0.1 to 40% by weight, more preferably in the range of 5 to 25% by weight, based on the total weight of the fine processing agent. If the ammonium fluoride content is less than 0.1% by weight, it will be difficult to control the ammonium fluoride concentration so that there may be significant variations in the etch rate for a silicon oxide film. If the ammonium fluoride content is more than 40% by weight, it will be close to the saturation solubility of ammonium fluoride so that a reduction in the liquid temperature of the fine processing agent may lead to the attainment of the saturation solubility of the fine processing agent to cause crystal precipitation in the liquid.

In an embodiment of the invention, the addition of the component (a) makes it possible to selectively reduce the etch rate for a silicon nitride film so that high etching selectivity (silicon oxide film/silicon nitride film) can be achieved. More specifically, when the component (a) is added, for example, the etch rate for a silicon nitride film can be reduced to 80% or less of that obtained when the component (a) is not added.

The component (a) may be hydrogen fluoride or ammonium fluoride alone or a mixture of hydrogen fluoride and ammonium fluoride. The component (a) may further contain a third component. For example, the third component may be a surfactant or an inorganic acid. It should be noted that the addition of an organic acid such as formic acid may reduce the effect of selectively inhibiting the etching of a silicon nitride film and therefore is not preferred.

For example, when the component (a) includes hydrofluoric acid alone, a non-limiting example of the surfactant is preferably at least one nonionic surfactant selected from the group consisting of polyethylene glycol alkyl ether, polyethylene glycol alkyl phenyl ether, and polyethylene glycol fatty acid ester. When the component (a) includes a mixture of hydrofluoric acid and ammonium fluoride or ammonium fluoride alone, at least one selected from the group consisting of an aliphatic alcohol, an aliphatic carboxylic acid, a hydrofluoroalkyl alcohol, a hydrofluoroalkyl carboxylic acid, a hydrofluoroalkyl carboxylic acid salt, an aliphatic amine salt, and an aliphatic sulfonic acid may be used in the form of a solid as it is or in the form of a liquid.

The content of the surfactant is preferably in the range of 0.001 to 0.1% by weight, more preferably in the range of 0.003 to 0.05% by weight, based on the total weight of the fine processing agent. The added surfactant can inhibit roughening of the surface of a silicon nitride film, a semiconductor substrate, or any other material during an etching process. In ultra large scale integration, conventional etchants are more likely to remain locally on a finely patterned surface of a semiconductor substrate, so that uniform etching becomes more difficult when the resist spacing is set at about 0.5 µm or less. In contrast, when the surfactant-containing fine processing agent according to the invention is used as an etchant, the etchant has improved wettability to the surface of a semiconductor substrate, so that the in-plane uniformity of etching across the substrate is improved. If the content is less than 0.001% by weight, the surface tension of the fine processing agent may be reduced insufficiently, so that the effect of improving wettability may be insufficient. If the content is more than 0.1% by weight, not only the resulting effect may fail to be proportional to the content, but also defoaming ability may be degraded so that foam may adhere to the etched surface to cause uneven etching or that foam may enter fine spaces to cause etching failure.

Examples of the inorganic acid include, but are not limited to, hydrochloric acid, sulfuric acid, and phosphoric acid. The content of the inorganic acid is preferably in the range of 0.01 to 30% by weight, more preferably in the range of 0.05 to 10% by weight, based on the total weight of the fine processing agent. If the content is less than 0.01% by weight, it may be difficult to control the inorganic acid concentration so that the problem of significant variations in the etch rate for a silicon oxide film may occur. On the other hand, if the content is more than 30% by weight, high vapor pressure may be produced, for example, when hydrochloric acid is used, so that the problem of unstable chemical solution composition may occur due to the vaporization.

The component (c) includes a water-soluble polymer of at least one selected from the group consisting of acrylic acid, ammonium acrylate, an acrylic acid ester, acrylamide, styrenesulfonic acid, ammonium styrenesulfonate, and a styrenesulfonic acid ester.

Among the listed water-soluble polymers, a copolymer of ammonium acrylate and methyl acrylate is highly effective in inhibiting the etching of a silicon nitride film, particularly when the component (a) includes hydrogen fluoride alone or a combination of hydrogen fluoride and ammonium fluoride. Ammonium acrylate and methyl acrylate are preferably copolymerized in a ratio of 9.9:0.1 to 5:5. If the copolymerization ratio of methyl acrylate exceeds the value range, a problem may occur in which the copolymer of ammonium acrylate and methyl acrylate has low solubility. Polyacrylamide is also highly effective in inhibiting the etching of a silicon nitride film, particularly when the component (a) includes a combination of hydrogen fluoride and ammonium fluoride or a combination of hydrogen fluoride and hydrochloric acid.

The content of the water-soluble polymer as the component (c) is preferably in the range of 0.001 to 10% by weight, more preferably in the range of 0.1 to 5% by weight, based on the total weight of the fine processing agent. If the content is less than 0.001% by weight, the effect of the addition of the water-soluble polymer will be low so that the effect of reducing the etch rate for a silicon nitride film will be insufficient, which is not preferred. If the content is more than 10% by weight, the fine processing agent will have more metal impurities and higher viscosity, so that the ability to remove the fine processing agent by rinsing with a rinse agent such as ultrapure water will be reduced. The resulting fine processing agent will be unsuitable for use in semiconductor device manufacturing processes.

The water-soluble polymer preferably has a weight average molecular weight in the range of 1,000 to 1,000,000, more preferably in the range of 1,000 to 10,000. When the weight average molecular weight is less than 1,000, a stabilizer serving as a polymerization inhibitor is used in a relatively large amount. As a result, this may be a cause of contamination of the fine processing agent with metal or the like. If the weight average molecular weight is more than 1,000,000, the fine processing agent may have high viscosity so that its handleability may be reduced. In this case, the ability to remove the fine processing agent by rinsing with a rinse agent such as ultrapure water may also be reduced.

In an embodiment of the invention, the fine processing agent may further contain a non-surfactant additive as long as the effects are not inhibited. Examples of such an additive include hydrogen peroxide and a chelating agent.

Depending on the desired purity of the fine surface processing agent, the water-soluble polymer to be added may be purified using distillation, ion-exchange resin, ion-exchange membrane, electrodialysis, filtration, or the like, or the fine processing agent may be purified by circulation filtration or the like.

Next, a description is given of a fine processing method using the fine processing agent according to an embodiment of the invention, in which wet etching is used as an example.

In an embodiment of the invention, the fine processing agent may be used in various wet etching methods. Etching methods include immersion methods, spraying methods, etc., and the fine processing agent of the invention may be used in any of these methods. Immersion methods are preferred, because vaporization-induced changes in the composition of the fine processing agent are small in the etching process.

When the fine processing agent is used as an etchant, the etching temperature (the temperature of the etchant) is preferably in the range of 5 to 50° C., more preferably in the range of 15 to 35° C., even more preferably in the range of 20 to 30° C. Within the above range, vaporization of the fine processing agent can be suppressed so that changes in composition can be prevented. At high temperature, the etch rate becomes difficult to control due to the evaporation of the fine processing agent, and at low temperature, some components of the fine processing agent are more likely to crystallize so that the etch rate can decrease or particles in the liquid can increase. Within the above range, these disadvantages can also be avoided. Depending on the etching temperature, the etch rate varies from one film to another, and therefore, the difference between the etch rate for a silicon oxide film and the etch rate for a silicon nitride film may be influenced in some cases.

In an embodiment of the invention, the fine processing agent preferably has an etch rate in the range of 1 to 5,000 nm/minute, more preferably in the range of 15 to 1,000 nm/minute, for a silicon oxide film at 25° C. If the etch rate is less than 1 nm/minute, fine processing such as etching may take a long time so that production efficiency may be deteriorated. If it is more than 5,000 nm/minute, a reduction in film thickness controllability after the etching or roughening of the substrate surface (the opposite surface from the surface on which a silicon oxide film or the like is formed) may be significant, so that the yield may be lowered.

EXAMPLES

Hereinafter, preferred examples of the invention are illustratively described in detail. It will be understood that the materials, the amounts, and so on described in the examples are illustrative only and are not intended to limit the scope of the invention, unless otherwise specified.

(Etch Rates for Silicon Oxide Film and Silicon Nitride Film)

An optical film thickness meter (Nanospec 6100 manufactured by Nanometrics Japan LTD) was used to measure the thicknesses of a silicon oxide film and a silicon nitride film before and after etching, and to determine changes in film thickness caused by the etching. The measurement was repeatedly performed for three different etching times when the etch rates were calculated.

(Water-Soluble Polymer)

The water-soluble polymer used in each example described below and the additive used in each comparative example are shown in Table 1.

TABLE 1

| Compound name | Structural formula |
| --- | --- |
| Poly(ammonium acrylate) | $[-CH_2-CH(CO_2NH_4)-]n$ (Mw = 6000) |
| Ammonium acrylate/methyl acrylate copolymer | $[-CH_2-CH(CO_2NH_4)-]m$ $[-CH_2-CH(CO_2CH_3)-]n$ (Mw = 8000, m:n 7:3) |
| Poly(ammonium styrenesulfonate) | $[-CH_2-CH-]n$ with phenyl-$SO_3-NH_4^+$ (Mw = 10000) |
| Poly(ammonium styrenesulfonate) | $[-CH_2-CH-]n$ with phenyl-$SO_3-NH_4^+$ (Mw = 70000) |
| Polyacrylamide | $[-CH_2-CH(CONH_2)-]n$ (Mw = 10000) |
| Polyacrylamide | $[-CH_2-CH(CONH_2)-]n$ (Mw = 1500) |
| Polyethylene glycol | $[-CH_2-CHO-]n$ (Mw = 1000) |

TABLE 1-continued

| Compound name | Structural formula |
| --- | --- |
| Ammonium acetate | $CH_3CO_2NH_4$ |
| Methyl acetate | $CH_3CO_2CH_3$ |
| Methyl propionate | $CH_3CH_2CO_2CH_3$ |

Example 1

A solution of a mixture of 7.0 parts by weight of hydrogen fluoride (high-purity grade for semiconductor applications, 50% by weight in concentration, manufactured by Stella Chemifa Corporation), 50.0 parts by weight of ammonium fluoride (high-purity grade for semiconductor applications, 40% by weight in concentration, manufactured by Stella Chemifa Corporation), and 40.5 parts by weight of ultrapure water was prepared, and 2.5 parts by weight of poly(ammonium acrylate) (6,000 in weight average molecular weight, 40% by weight in concentration) as a water-soluble polymer was added to the solution. After mixing and stirring, the liquid mixture was adjusted to a temperature of 25° C. and allowed to stand for 3 hours. Thus, an etchant (a fine processing agent) was prepared which contained 3.5% by weight of hydrogen fluoride, 20.0% by weight of ammonium fluoride, and 1% by weight of poly(ammonium acrylate).

Subsequently, etch rates were measured for a TEOS film, as a silicon oxide film, and a silicon nitride film, respectively. In addition, etch rate selectivity (silicon oxide film/silicon nitride film) was also evaluated. The results are shown in Table 2 below.

Examples 2 to 10

In Examples 2 to 10, etchants were prepared as in Example 1, except that the contents of hydrogen fluoride and ammonium fluoride and the type and content of the water-soluble polymer were changed as shown in Table 1. Using the etchant obtained in each example, etch rates for a TEOS film and a silicon nitride film, and etch rate selectivity (silicon oxide film/silicon nitride film) were also evaluated. The results are shown in Table 2 below.

Comparative Examples 1 and 2

In Comparative Examples 1 and 2, etchants were prepared as in Example 1, except that the contents of hydrogen fluoride and ammonium fluoride were changed as shown in Table 1 and that no water-soluble polymer was added. Using the etchant obtained in each comparative example, etch rates for a TEOS film and a silicon nitride film, and etch rate selectivity (silicon oxide film/silicon nitride film) were also evaluated. The results are shown in Table 2 below.

Comparative Examples 3 to 7

In Comparative Examples 3 to 7, etchants were prepared as in Example 1, except that the contents of hydrogen fluoride and ammonium fluoride were changed as shown in Table 1 and that the additive shown in Table 1 was used in place of the water-soluble polymer. Using the etchant obtained in each comparative example, etch rates for a TEOS film and a silicon nitride film, and etch rate selectivity (silicon oxide film/silicon nitride film) were also evaluated. The results are shown in Table 2 below.

TABLE 2

|  | Concentration | | Additive | | | Etch rate (25° C.) | | Etch rate selectivity (silicon oxide film/silicon nitride film) |
| --- | --- | --- | --- | --- | --- | --- | --- | --- |
|  | Hydrogen fluoride [wt %] | Ammonium fluoride [wt %] | Type | Weight average molecular weight | Concentration [wt %] | TEOS film (silicon oxide film) [Å/minute] | Silicon nitride film [Å/minute] |  |
| Example 1 | 3.5 | 20 | Poly(ammonium acrylate) | 6000 | 1 | 1800 | 23.7 | 76 |
| Example 2 | 3.5 | 20 | Copolymer of ammonium acrylate and methyl acrylate | 8000 | 1 | 1816 | 17.3 | 105 |
| Example 3 | 3.5 | 20 | Poly(ammonium styrenesulfonate) | 10000 | 0.1 | 1884 | 23.8 | 79 |
| Example 4 | 3.5 | 20 | Poly(ammonium styrenesulfonate) | 70000 | 0.5 | 1868 | 23.6 | 79 |
| Example 5 | 3.5 | 20 | Polyacrylamide | 10000 | 3 | 1842 | 16.4 | 112 |
| Example 6 | 3.5 | 20 | Polyacrylamide | 1500 | 1 | 1884 | 18.8 | 100 |
| Example 7 | 3.5 | 0 | Poly(ammonium acrylate) | 6000 | 1 | 752 | 45.4 | 17 |
| Example 8 | 3.5 | 0 | Poly(ammonium acrylate) | 6000 | 3 | 949 | 39.8 | 24 |
| Example 9 | 3.5 | 0 | Copolymer of ammonium acrylate and methyl acrylate | 8000 | 1 | 734 | 35.3 | 21 |
| Example 10 | 3.5 | 0 | Polyacrylamide | 10000 | 3 | 652 | 34.7 | 19 |
| Comparative Example 1 | 3.5 | 20 | — | — | — | 1850 | 33.0 | 56 |
| Comparative Example 2 | 3.5 | 0 | — | — | — | 637 | 50.0 | 13 |
| Comparative Example 3 | 3.5 | 20 | Polyethylene glycol | 1000 | 0.1 | 1884 | 32.5 | 58 |
| Comparative Example 4 | 3.5 | 20 | Polyethylene glycol | 1000 | 3 | 1824 | 32.3 | 56 |
| Comparative Example 5 | 3.5 | 0 | Ammonium acetate | — | 1 | 1911 | 32.8 | 58 |
| Comparative Example 6 | 3.5 | 20 | Methyl acetate | — | 1 | 1877 | 34.3 | 55 |
| Comparative Example 7 | 3.5 | 20 | Methyl propionate | — | 1 | 1881 | 33.8 | 56 |

As is also evident from Table 2, when the additive was added to the etchant according to any one of Comparative Examples 3 to 7, it was neither possible to selectively reduce the etch rate for a silicon nitride film nor to increase the etch rate selectivity of a silicon oxide film to a silicon nitride film (silicon oxide film/silicon nitride film).

On the other hand, it was demonstrated that using the surface fine processing agent according to any one of Examples 1 to 10, to which a water-soluble polymer was added, the etch rate for a silicon nitride film was selectively reduced, so that the etch rate selectivity of a silicon oxide film to a silicon nitride film (silicon oxide film/silicon nitride film) increased.

Example 11

A solution of a mixture of 20.0 parts by weight of hydrogen fluoride (high-purity grade for semiconductor applications, 50% by weight in concentration, manufactured by Stella Chemifa Corporation), 27.8 parts by weight of hydrochloric acid (electronic industry grade, 36% by weight in concentration, manufactured by HAYASHI PURE CHEMICAL IND., LTD.), and 51.2 parts by weight of ultrapure water was prepared, and 1.0 part by weight of polyacrylamide (10,000 in weight average molecular weight, 50% by weight in concentration) as a water-soluble polymer was added to the solution. After mixing and stirring, the liquid mixture was adjusted to a temperature of 25° C. and allowed to stand for 3 hours. Thus, an etchant (a fine processing agent) was prepared which contained 10% by weight of hydrogen fluoride, 10% by weight of hydrochloric acid, and 0.5% by weight of polyacrylamide.

Subsequently, etch rates were measured for a BPSG film, as a silicon oxide film, and a silicon nitride film, respectively. In addition, etch rate selectivity (silicon oxide film/silicon nitride film) was also evaluated. The results are shown in Table 3 below.

Example 12

In Example 12, an etchant was prepared as in Example 11, except that the content of polyacrylamide was changed as shown in Table 3. Using the etchant obtained in this example, etch rates for a BPSG film and a silicon nitride film, and etch rate selectivity (silicon oxide film/silicon nitride film) were also evaluated. The results are shown in Table 3 below.

Comparative Example 8

In Comparative Example 8, an etchant was prepared as in Example 12, except that no water-soluble polymer was added as shown in Table 3. Using the etchant obtained in this comparative example, etch rates for a BPSG film and a silicon nitride film, and etch rate selectivity (silicon oxide film/silicon nitride film) were also evaluated. The results are shown in Table 3 below.

TABLE 3

|  | Concentration | | Additive | | | Etch rate (25° C.) | | Etch rate selectivity (silicon oxide film/silicon nitride film) |
|---|---|---|---|---|---|---|---|---|
|  | Hydrogen fluoride [wt %] | Hydrochloric acid [wt %] | Type | Weight average molecular weight | Concentration [wt %] | BPSG film (silicon oxide film) [Å/minute] | Silicon nitride film [Å/minute] |  |
| Example 11 | 10 | 10 | Polyacrylamide | 10000 | 0.5 | 18885 | 46.3 | 408 |
| Example 12 | 10 | 10 | Polyacrylamide | 10000 | 1 | 18970 | 44.3 | 429 |
| Comparative Example 8 | 10 | 10 | — | — | — | 18316 | 116.1 | 158 |

As shown in Table 3, it was demonstrated that using the etchants according to Examples 11 to 12, to all of which polyacrylamide was added as a water-soluble polymer, the etch rate for a silicon nitride film was selectively reduced, so that the etch rate selectivity of a silicon oxide film to a silicon nitride film (silicon oxide film/silicon nitride film) increased.

Example 13

A solution of a mixture of 25.0 parts by weight of ammonium fluoride (high-purity grade for semiconductor applications, 40% by weight in concentration, manufactured by Stella Chemifa Corporation), 27.8 parts by weight of hydrochloric acid (electronic industry grade, 36% by weight in concentration, manufactured by HAYASHI PURE CHEMICAL IND., LTD.), and 45.2 parts by weight of ultrapure water was prepared, and 2.0 parts by weight of polyacrylamide (10,000 in weight average molecular weight, 50% by weight in concentration) as a water-soluble polymer was added to the solution. After mixing and stirring, the liquid mixture was adjusted to a temperature of 25° C. and allowed to stand for 3 hours. Thus, an etchant (a fine processing agent) was prepared which contained 10% by weight of ammonium fluoride, 10% by weight of hydrochloric acid, and 1% by weight of polyacrylamide.

Subsequently, etch rates were measured for a TEOS film, as a silicon oxide film, and a silicon nitride film, respectively. In addition, etch rate selectivity (silicon oxide film/silicon nitride film) was also evaluated. The results are shown in Table 4 below.

Comparative Example 9

In Comparative Example 9, an etchant was prepared as in Example 13, except that no water-soluble polymer was added as shown in Table 4. Using the etchant obtained in this comparative example, etch rates for a TEOS film and a silicon nitride film, and etch rate selectivity (silicon oxide film/silicon nitride film) were also evaluated. The results are shown in Table 4 below.

Example 14

A solution of a mixture of 25.0 parts by weight of ammonium fluoride (high-purity grade for semiconductor applications, 40% by weight in concentration, manufactured by Stella Chemifa Corporation), 23.5 parts by weight of phosphoric acid (electronic industry grade, 85% by weight in concentration, manufactured by Kishida Chemical Co., Ltd.), and 49.5 parts by weight of ultrapure water was prepared, and 2.0 parts by weight of polyacrylamide (10,000 in weight average molecular weight, 50% by weight in concentration) as a water-soluble polymer was added to the solution. After mixing and stirring, the liquid mixture was adjusted to a temperature of 25° C. and allowed to stand for 3 hours. Thus, an etchant (a fine processing agent) was prepared which contained 10% by weight of ammonium fluoride, 20% by weight of phosphoric acid, and 1% by weight of polyacrylamide.

Subsequently, etch rates were measured for a TEOS film, as a silicon oxide film, and a silicon nitride film, respectively. In addition, etch rate selectivity (silicon oxide film/silicon nitride film) was also evaluated. The results are shown in Table 4 below.

Comparative Example 10

In Comparative Example 10, an etchant was prepared as in Example 14, except that no water-soluble polymer was added as shown in Table 4. Using the etchant obtained in this comparative example, etch rates for a TEOS film and a silicon nitride film, and etch rate selectivity (silicon oxide film/silicon nitride film) were also evaluated. The results are shown in Table 4 below.

TABLE 4

|  | Concentration | | | Additive | | | Etch rate (25° C.) | | Etch rate selectivity (silicon oxide film/silicon nitride film) |
|---|---|---|---|---|---|---|---|---|---|
|  | Ammonium fluoride [wt %] | Hydrochloric acid [wt %] | Phosphoric acid [wt %] | Type | Weight average molecular weight | Concentration [wt %] | TEOS film (silicon oxide film) [Å/minute] | Silicon nitride film [Å/minute] |  |
| Example 13 | 10 | 10 | — | Polyacrylamide | 10000 | 1 | 1811 | 52.0 | 35 |
| Example 14 | 10 | — | 20 | Polyacrylamide | 10000 | 1 | 2654 | 43.0 | 62 |
| Comparative Example 9 | 10 | 10 | — | — | — | — | 1796 | 61.4 | 29 |

TABLE 4-continued

| | Concentration | | | Additive | | | Etch rate (25° C.) | | Etch rate selectivity |
|---|---|---|---|---|---|---|---|---|---|
| | Ammonium fluoride [wt %] | Hydrochloric acid [wt %] | Phosphoric acid [wt %] | Type — | Weight average molecular weight — | Concentration [wt %] | TEOS film (silicon oxide film) [Å/minute] | Silicon nitride film [Å/minute] | (silicon oxide film/silicon nitride film) — |
| Comparative Example 10 | 10 | — | 20 | — | — | — | 2657 | 56.2 | 47 |

As shown in Table 4, it was demonstrated that using the etchants according to Examples 13 to 14, to all of which polyacrylamide was added as a water-soluble polymer, the etch rate for a silicon nitride film was selectively reduced, so that the etch rate selectivity of a silicon oxide film to a silicon nitride film (silicon oxide film/silicon nitride film) increased.

The invention claimed is:

1. A fine processing agent that provides etching and cleaning of a surface of a target film, comprising:
   (a) 0.01 to 15% by weight of hydrogen fluoride and 0.1 to 40% by weight of ammonium fluoride;
   (b) water; and
   (c) 0.001 to 10% by weight of a water-soluble polymer of at least one selected from the group consisting of styrenesulfonic acid and ammonium styrenesulfonate, wherein said fine processing agent has an etch rate in the range of 1 to 5,000 nm/minute for a silicon oxide film at 25° C.

2. The fine processing agent according to claim 1, wherein the water-soluble polymer has a weight average molecular weight in the range of 1,000 to 1,000,000.

3. The fine processing agent according to claim 1, further comprising a surfactant.

4. The fine processing agent according to claim 3, wherein the component (a) comprises only hydrogen fluoride, and the surfactant is at least one nonionic surfactant selected from the group consisting of polyethylene glycol alkyl ether, polyethylene glycol alkyl phenyl ether, and polyethylene glycol fatty acid ester.

5. The fine processing agent according to claim 3, wherein the component (a) comprises hydrofluoric acid and ammonium fluoride or only ammonium fluoride, and the surfactant is at least one selected from the group consisting of an aliphatic alcohol, an aliphatic carboxylic acid, a hydrofluoroalkyl alcohol, a hydrofluoroalkyl carboxylic acid, a hydrofluoroalkyl carboxylic acid salt, an aliphatic amine salt, and an aliphatic sulfonic acid.

6. The fine processing agent according to claim 1, wherein the surfactant has a content of 0.001 to 0.1% by weight.

7. The fine processing agent according to claim 1, wherein the component (a) further comprises an inorganic acid.

8. The fine processing agent according to claim 1, wherein the inorganic acid has a content of 0.01 to 30% by weight.

9. The fine processing agent according to claim 1, wherein the component (a) contains no organic acid.

10. A fine processing method, comprising etching and cleaning of a surface of a silicon oxide film in a laminated film in which at least the silicon oxide film and a silicon nitride film are laminated, using the fine processing agent according to claim 1.

11. The fine processing method according to claim 10, wherein the silicon oxide film is any one of a natural oxide film, a thermal silicon oxide film, a non-doped silicate glass film, a phosphorus-doped silicate glass film, a boron-doped silicate glass film, a boron-and-phosphorus-doped silicate glass film, a TEOS film, or a fluorine-containing silicon oxide film.

12. The fine processing method according to claim 10, wherein the silicon nitride film is a silicon nitride film or a silicon oxynitride film.

13. The fine processing method according to claim 10, wherein the fine processing agent is used at a liquid temperature in the range of 5 to 50° C.

* * * * *